United States Patent

Kawahata et al.

[11] Patent Number: 5,097,160
[45] Date of Patent: Mar. 17, 1992

[54] METHOD OF TRANSMITTING PULSE SIGNAL AND APPARATUS THEREFOR

[75] Inventors: Shigeyuki Kawahata, Hitachi; Susumu Murakami, Katsuta; Eisuke Sato, Yokohama; Tadaaki Kariya, Ibaraki; Kazunori Morozumi, Katsuta, all of Japan

[73] Assignee: Hitachi, Ltd., Tokyo, Japan

[21] Appl. No.: 494,667

[22] Filed: Mar. 16, 1990

[30] Foreign Application Priority Data

Mar. 17, 1989 [JP] Japan .................................. 1-063752

[51] Int. Cl.$^5$ ............................................. H03K 17/72
[52] U.S. Cl. ........................... 307/630; 307/305; 307/639; 307/643; 357/38; 357/39
[58] Field of Search ................... 307/2, 248, 249, 256, 307/259, 319, 630, 638, 643, 305, 639; 357/38, 39

[56] References Cited

U.S. PATENT DOCUMENTS

| | | | |
|---|---|---|---|
| 2,723,355 | 11/1955 | Graham | 307/259 |
| 2,877,451 | 3/1959 | Williams | 307/319 |
| 3,496,390 | 2/1970 | Fischer | 357/38 |
| 3,504,199 | 3/1970 | Cooperman | 307/319 |
| 3,689,912 | 9/1972 | Dick | 307/319 |
| 4,220,874 | 9/1980 | Iwata et al. | 307/256 |

Primary Examiner—John Zazworsky
Attorney, Agent, or Firm—Antonelli, Terry, Stout & Kraus

[57] ABSTRACT

A method of transmitting a pulse signal composed of a combination of a positive pulse and a negative pulse through a semiconductor switch providing a conduction modulation in the on-state, the positive pulse and negative pulse flowing through the semiconductor switch in the forward and reverse directions, respectively, relative to the semiconductor switch. An offset current is superposed upon the pulse signal so as to make the absolute value of the positive pulse larger than that of the negative pulse.

37 Claims, 6 Drawing Sheets

FIG. 1
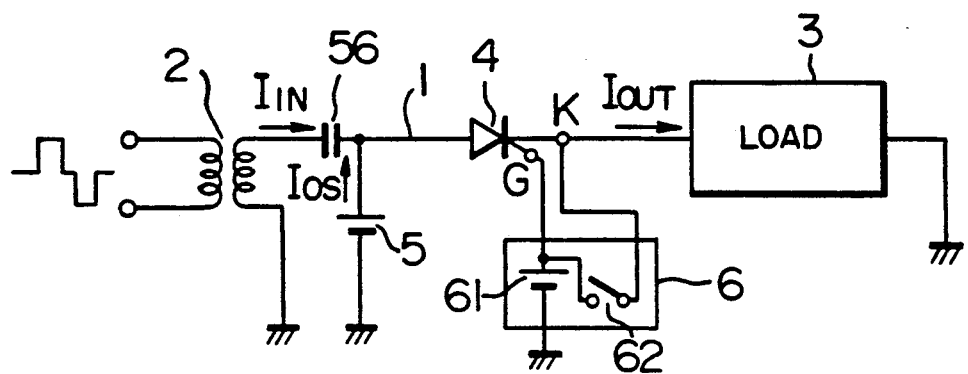
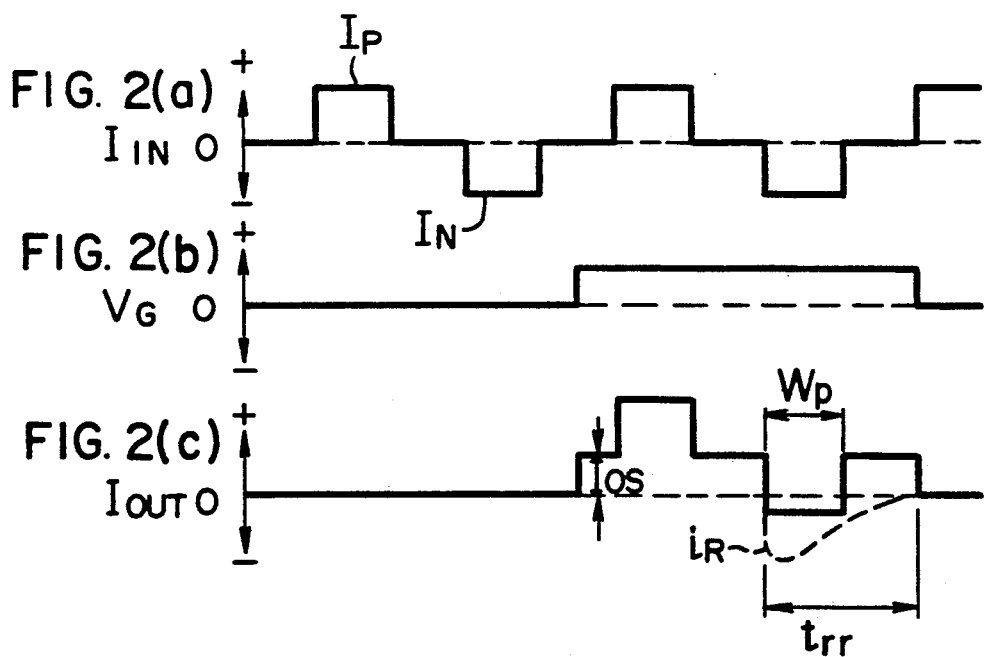

FIG. 3
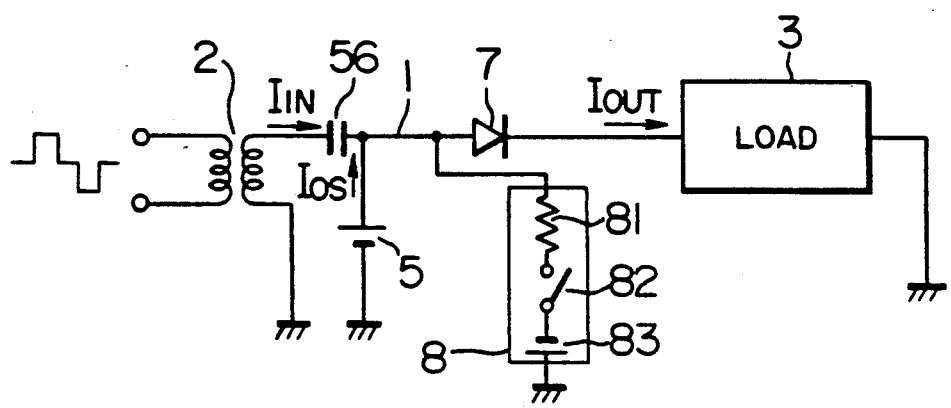
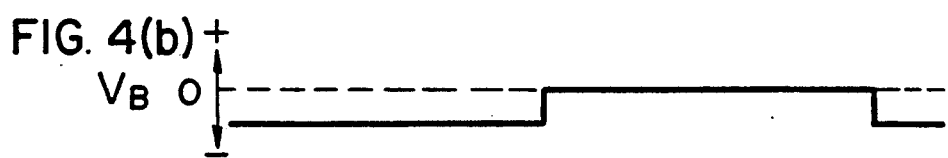
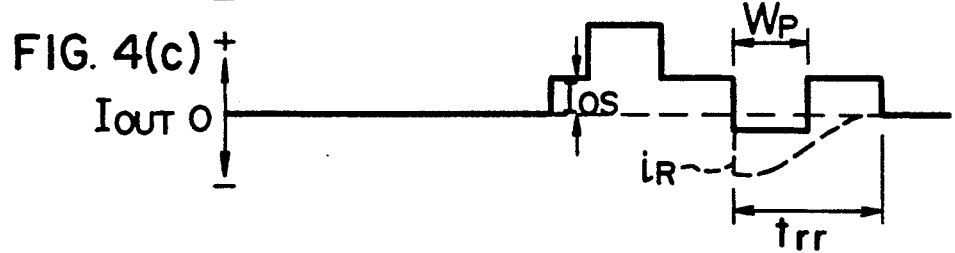

METHOD OF TRANSMITTING PULSE SIGNAL AND APPARATUS THEREFOR

BACKGROUND OF THE INVENTION

The present invention relates to a method of and apparatus for bidirectionally transmitting a pulse signal by using a unidirectional semiconductor switch.

As a method of bidirectionally transmitting a pulse signal using a unidirectional semiconductor switch, there is known a method as disclosed in Japanese Patent Laid-open Publication JP-A-60-31312 whereby a pulse signal is transmitted while applying a negative voltage sufficiently larger than the peak value of the pulse signal to the cathode of a diode or thyristor. According to this method, a pulse signal current always flows as the forward current of the diode or thyristor, thereby allowing to bidirectionally transmit a pulse signal by using a single unidirectional semiconductor switch. There is known another method as disclosed in Japanese Patent Laid-open Publication JP-A-56-90625 wherein there is used a diode or thyristor having a large reverse recovery current. According to this method, a pulse signal is caused to flow in the reverse direction during the period while the reverse recovery current flows, thereby allowing to bidirectionally transmit a pulse signal by using a single unidirectional semiconductor switch.

The former method is associated with a problem that a positive pulse of the pulse signal has waveform distortion. The reason for this is that since the former method provides an offset current larger than the peak value of the pulse current to allow all positive and negative pulses to flow in the same direction, a maximum current passing through the semiconductor switch becomes large and therefore the region of poor linearity within the voltage-current characteristic of the semiconductor switch is inevitably used. In order to solve this problem, it is necessary to make the conduction area of a semiconductor switch unnecessarily large. The latter method is associated with a problem that a negative pulse of the pulse signal has waveform distortion. The reason for this is that if the pulse current flowing through a semiconductor switch in the reverse direction is larger than the reverse recovery current of the semiconductor switch, the pulse current is limited by the reverse recovery current and the actual current allowed to flow becomes smaller than the desired value.

SUMMARY OF THE INVENTION

It is an object of the present invention to provide a method of and apparatus for bidirectionally transmitting a pulse signal by using a unidirectional semiconductor switch without making large the size of the semiconductor switch.

According to an aspect of the pulse signal transmission method of this invention achieving the above object, there is used a semiconductor switch which provides conductance modulation in an on-state. In transmitting a pulse signal formed by a combination of positive and negative pulses which flow through the semiconductor switch in the positive and reverse directions respectively, an offset current is superposed upon the pulse signal such that the absolute value of the positive pulse becomes larger than that of the negative pulse.

As for a semiconductor switch providing conductance modulation in an on-state, there are known a unidirectional thyristor (inclusive of a gate turn-on thyristor) of an electric gate type, MOS gate type or optical gate type, a unidirectional static induction thyristor, an insulating gate type bipolar transistor (IGBT), and a diode having a switching function in combination with a bias power source. These semiconductor switches have a common characteristic that when the polarity of a voltage applied across the main electrodes changes and an on-state changes to an off-state, a current called a reverse recovery current flows between the main electrodes in the direction opposite to that at the on-state. According to the pulse signal transmission method of this invention, a negative pulse of the pulse signal is transmitted during the period while the reverse recovery current flows.

For transmitting a negative pulse during the reverse recovery period of a semiconductor switch, it is necessary to make the width of the negative pulse equal to or shorter than 10 microseconds. A conceivable pulse signal includes, for example: (1) a combination of positive pulses and negative pulses in which both have substantially the same peak value: (2) a combination of positive pulses and negative pulses in which both have substantially the same peak value, and a zero level interposed therebetween: and (3) a combination of two types of positive pulses having different peak values, and two types of negative pulses having different peak values.

The amplitude of an offset current superposed upon a pulse signal is set large enough to obtain a reverse recovery period necessary for transmitting a negative pulse without any distortion. Specifically, the amplitude is set equal to or larger than 5% and smaller than 50%, or preferably equal to or larger than 25% and smaller than 50%, respectively, of the sum of the peak values of a positive pulse and a negative pulse.

According to an aspect of the pulse signal transmission apparatus of this invention achieving the above object, the apparatus includes a pulse signal transmission path for transmitting a pulse signal from its input side to its output side, a semiconductor switch provided at the pulse signal transmission path which switch provides a conductance modulation in the on-state, and means for supplying an offset current to the pulse signal transmission path, the offset current flowing in the forward direction of the semiconductor switch.

The pulse signal, semiconductor switch and offset current in this apparatus are also required to satisfy the above-described requirements.

As the means for supplying the offset current, it is preferable to use a constant current source, or a constant current superposed upon a pulse signal for another purpose may be used as the offset current.

According to an aspect of a semiconductor switch suitable for use in transmitting a pulse signal in accordance with the present invention, the semiconductor switch includes a semiconductor substrate having a first region of one conductivity type, second and third regions of the other conductivity type formed within the first region to form first and second p-n junctions respectively relative to the first region, a fourth region of the one conductivity type formed within the second region to form a third p-n junction relative to the second region, and a small region of the one conductivity type formed within the third region, a first main electrode in ohmic contact with the third region and small region within the semiconductor substrate, a second main electrode in ohmic contact with the fourth region within the semiconductor substrate, and a control electrode coupled to the second region within the semiconductor substrate.

First, upon application of a positive pulse to a semiconductor switch providing a conductance modulation in the on-state, the semiconductor switch turns on and a forward current corresponding to the peak value of the positive pulse flows because the positive pulse is in the forward direction relative to the semiconductor switch. Next, upon application of a negative pulse to the semiconductor switch, the semiconductor switch starts to change from the on-state to the off-state because the negative pulse is in the reverse direction relative to the semiconductor switch. At this time, carriers stored and remained within the semiconductor switch when the forward current flowed during the on-state are released through the main electrodes of the semiconductor switch so that a reverse current (reverse recovery current) flows through the semiconductor switch. If the period during which the reverse recovery current flows is longer than the width of the negative pulse, it is possible to transmit a pulse signal in the reverse direction by using a unidirectional semiconductor switch. To this end, it is necessary to make long the reverse recovery period of a semiconductor switch. If the amplitude of the reverse recovery current is larger than the peak value of the negative pulse during the period while the negative pulse is transmitted, it becomes possible to bidirectionally transmit a pulse signal by using a unidirectional semiconductor switch without generating waveform distortion. The offset current according to this invention contributes to making the peak value of the positive pulse larger than that of the negative pulse when they pass (flow) through the semiconductor switch thereby effectively making the reverse recovery period longer than the negative pulse width and the reverse recovery current larger than the peak value. It becomes therefore possible to bidirectionally transmit a pulse signal by using a unidirectional semiconductor switch without generating waveform distortion.

A pulse signal to be transmitted includes a pulse signal having both positive and negative pulses with zero levels interposed therebetween. In transmitting such a pulse signal by using a unidirectional semiconductor switch, the transmission period allowed for a negative pulse is a short period corresponding to that obtained by subtracting the zero level period from the reverse recovery period, thereby arising a difficulty in bidirectionally transmitting a pulse signal correctly. If however an offset current is superposed upon a pulse signal, the period while a zero level is applied to the semiconductor switch is eliminated to thus solve the above-described difficulty.

Further, a small region of the opposite conductivity type is formed in the anode layer of a unidirectional thyristor, i.e., in the outer side p-layer of the p-n-p-n four layers thereof. While the thyristor changes its state from the on-state to the off-state, the small region injects carriers so that the reverse recovery period is made long and the reverse recovery current is made large. With such an arrangement, a thyristor is realized which is suitable for transmitting a negative pulse during the reverse recovery period of a semiconductor switch.

BRIEF DESCRIPTION OF THE DRAWINGS

FIG. 1 is a circuit diagram showing an embodiment of the pulse signal transmission apparatus according to this invention;

FIG. 2 shows waveforms used for explaining the operation of the apparatus shown in FIG. 1;

FIG. 3 is a circuit diagram showing another embodiment of the pulse signal transmission apparatus according to this invention;

FIG. 4 shows waveforms used for explaining the operation of the apparatus shown in FIG. 3;

DESCRIPTION OF PREFERRED EMBODIMENTS

Figure 5:
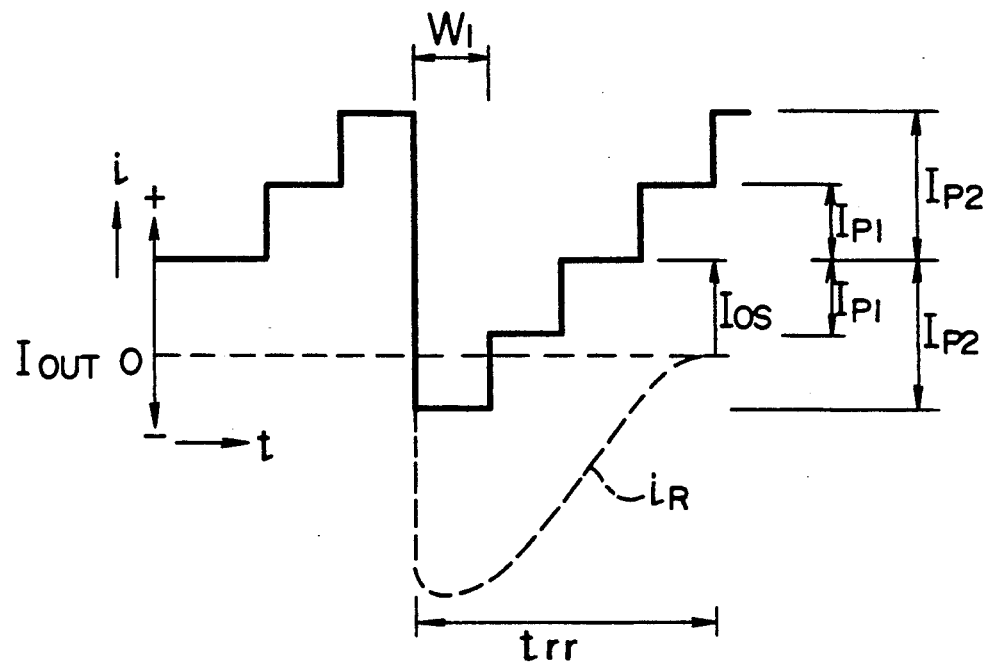
FIGS. 5 and 6 show waveforms of pulse signals capable of being transmitted according to this invention.

Preferred embodiments of this invention will be described in detail with reference to the accompanying drawings.

FIG. 1 shows a circuit diagram embodying a method of and apparatus for transmitting a pulse signal according to the present invention. A pulse signal transmission path generally designated by reference numeral 1 has a transformer connected to its input side and a load 3 connected to its output side. A unidirectional thyristor 4 of an electric gate type is provided at the pulse signal transmission path 1 such that the polarity of the thyristor shows the forward direction as viewed from the input side to the output side of the path 1. An offset power source 5 is also connected to the pulse signal transmission path 1 to supply an offset current. A capacitor 56 prevents a d.c. current from flowing from the offset power source 5 to the transformer 2. A control circuit 6 controls the turn on and off of the thyristor 4. The control circuit 6 includes at least a power source 61 for applying an on-signal to the gate G of the thyristor 4, and means 62 for shorting the gate G and cathode K to thereby turn off the thyristor 4. It is assumed that a pulse signal $I_{IN}$ shown in FIG. 2(a) is inputted to the primary winding of the transformer 2. The pulse signal $I_{IN}$ is composed of a positive pulse $I_P$ which is in the forward direction relative to the thyristor 4, a negative pulse $I_N$ which is in the reverse direction relative to the thyristor 4 and has substantially the same peak value as that of the positive pulse $I_P$, and a zero level interposed between the positive and negative pulses $I_P$ and $I_N$. The widths of the positive and negative pulses are substantially the same, and the duration of the zero level changes in dependence of the type of a pulse signal to be transmitted. FIG. 2(b) shows a control signal $V_G$ supplied from the control power source 6 to the gate G of the thyristor 4. FIG. 2(c) shows a pulse signal $I_{OUT}$ supplied to the load 3 from the thyristor 4 while the control signal $V_G$ is supplied. This pulse signal $I_{OUT}$ is composed of the pulse signal $I_{IN}$ shown in FIG. 2(a) and an offset current $I_{OS}$ from the offset power source 5 superposed upon the pulse signal $I_{IN}$. The positive signal portion of the pulse signal $I_{OUT}$ flows as a forward current of the thyristor, and the negative signal portion flows as a part of the reverse recovery current $i_R$ of the thyristor 4. The requirements necessary for the negative portion of the pulse signal $I_{OUT}$ to flow without any distortion are that the pulse width $W_P$ is shorter than the reverse recovery time $t_{rr}$ and the peak value is smaller than the reverse recovery current $i_R$ during the conduction interval. For example, a lateral thyristor formed on a silicon substrate having a life time of about 5 microseconds has a reverse recovery current of about 30 mA and reverse recovery time of about 4 microseconds, respectively, at a forward current of 500 A/cm². In such a case, if the negative portion of the pulse signal is set to have a peak value of 20 mA and a pulse width of 3 microseconds, a pulse signal can be transmitted bidirectionally without any practical problem.

The requirements necessary for the unidirectional thyristor to bidirectionally transmit a pulse signal without any distortion are satisfied by superposing an offset current to the pulse signal. An important matter of this invention is therefore at what amplitude the offset current is set. The present invention proposes the following three settings which may be selectively used in accordance with the allowable transmission precision of a pulse signal in a particular application.

(1) The amplitude of the offset current is set larger than 0% and smaller than 50% of the sum of peak values of the positive and negative pulses $I_P$ and $I_N$ of the pulse signal $I_{IN}$. The reason for setting the amplitude larger than 0% is that a negative pulse of the pulse signal shown in FIG. 2(a) is allowed to be transmitted by using the reverse recovery current. The reason for setting the amplitude smaller than 50% is that a waveform distortion of a negative pulse is eliminated. If the amplitude is set at 50%, a reverse current flows due to a built-in voltage until the forward biased p-n junction of the thyristor (diode) returns to its thermal equilibrium, and this reverse current is superposed upon the negative pulse, resulting in waveform distortion. On the other hand, if the amplitude is set lower than 50%, the negative pulse is transmitted during the reverse recovery period. Since the internal resistance of the semiconductor switch is 0 ohm during the reverse recovery period, a reverse current determined by the reverse bias voltage and an external resistor flows without superposition of the reverse current caused by the built-in voltage. Waveform distortion of the negative pulse is thereby eliminated.

(2) The amplitude of the offset current is set equal to or larger than 5% and smaller than 50% of the sum of peak values of the positive and negative pulses $I_P$ and $I_N$ of the pulse signal $I_{IN}$. If the amplitude is set equal to or larger than 5%, this offset current eliminates waveform distortion more effectively.

(3) The amplitude of the offset current is set equal to or larger than 25% and smaller than 50% of the sum of peak values of the positive and negative pulses $I_P$ and $I_N$ of the pulse signal $I_{IN}$. If the amplitude is set equal to or larger than 25%, this offset current eliminates waveform distortion still more effectively.

As described previously, it is necessary to set the pulse width $W_P$ shorter than the reverse recovery time $t_{rr}$ for the transmission of a negative pulse during the reverse recovery period of the thyristor. It has been found that a practical value of the pulse width $W_P$ is equal to or shorter than 10 microseconds. If the pulse width is longer than this value, waveform distortion appears so that the pulse signal transmission becomes unable to be used in practice.

In the circuit shown in FIG. 1, the thyristor 4 is turned off by shorting the gate G and cathode K. Other methods may be used instead. For example, an off-signal may be applied between the gate G and cathode K so as to make the potential of the cathode K positive.

Further, the transformer 2 to which the pulse signal $I_{IN}$ is inputted, may be omitted if isolation between the pulse signal transmission path and the device for supplying the pulse signal $I_{IN}$ is not necessary. The pulse signal $I_{IN}$ may be supplied via a transistor.

FIG. 3 shows another embodiment of the method of and apparatus for transmitting a pulse signal by using a diode as a semiconductor switch according to the present invention. The difference of this circuit from that shown in FIG. 1 is as follows. A diode 7 is provided in the pulse signal transmission path 1 such that the polarity of the diode shows the forward direction as viewed from the input side to the output side of the path 1. A control circuit 8 for controlling the turn on and off of the diode 7 is coupled to the anode of the diode 7, the control circuit 8 being constructed of a resistor 81, switch 82 and a d.c. power source. The d.c. power source 83 always biases the diode in the reverse direction. While a pulse signal $I_{IN}$ shown in FIG. 4(a) is not transmitted, the switch 82 is turned on so that the d.c. power source 83 applies a reverse voltage $V_B$ (shown in FIG. 4(b)) to the diode 7, the reverse voltage $V_B$ being larger than the sum of the peak value of the pulse signal $I_{IN}$ and the voltage of the offset power source 5, thereby biasing the diode 7 in the reverse direction and preventing the pulse signal $I_{IN}$ from being transmitted to the load 3. Upon turning off the switch 82, a pulse signal $I_{OUT}$ (FIG. 4(c)) is transmitted to the load, the pulse signal $I_{OUT}$ being composed of the pulse signal $I_{IN}$ and an offset current $I_{OS}$ superposed upon the pulse signal $I_{IN}$. The peak value of the negative portion of the pulse signal $I_{OUT}$ acting in the reverse direction of the diode 7 is smaller than the reverse recovery current $i_R$ of the diode 7, and the pulse width $W_P$ thereof is shorter than the reverse recovery time $t_{rr}$. In this embodiment, a pulse signal is transmitted with small waveform distortion by adding the offset current $I_{OS}$ to the pulse signal to the extent that the negative portion of the pulse signal has a peak value smaller than the reverse recovery current of the diode 7 provided in the pulse signal transmission path. The value of the offset current and the pulse signal width may be subjected to the same requirements as described with the embodiment of FIG. 1.

FIG. 5 shows an example of another pulse signal applicable to the present invention. This pulse signal with the superposed offset current $I_{OS}$ has four levels of values, that is $\pm I_{P1}$ and $\pm I_{P2}$, relative to the reference value $I_{OS}$. A broken line indicates the reverse recovery current $i_R$ of the semiconductor switch. On condition that the negative portion ($I_{OS}-I_{P2}$) of the pulse signal has a peak value smaller than the reverse recovery current $i_R$ and the pulse width $W_1$ thereof is shorter than the reverse recovery time $t_{rr}$, a pulse signal is transmitted by using a unidirectional semiconductor switch in accordance with the transmission method of this invention.

Figure 6:
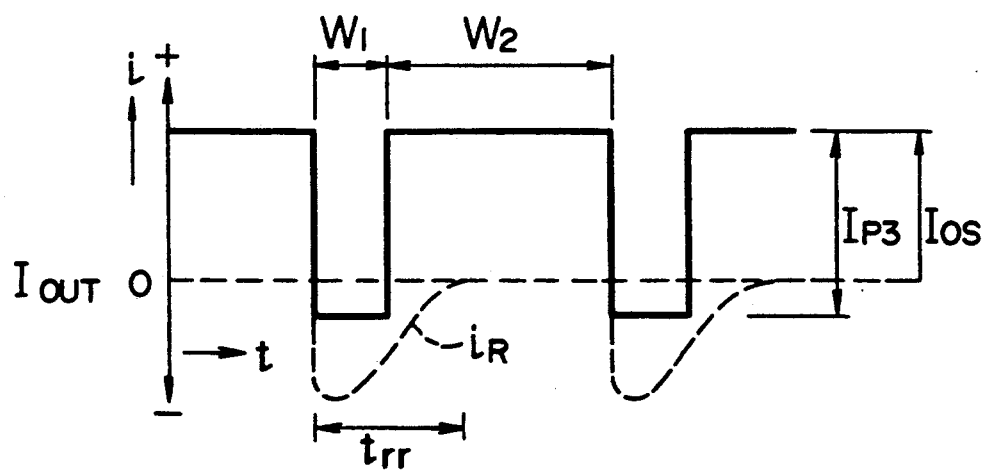

FIG. 6 shows another example of a pulse signal applicable to the present invention. This pulse signal with the superposed offset current $I_{OS}$ has two levels one being the reference level $I_{OS}$ and the other being a level ($I_{OS}-I_{P3}$) where the absolute value of $I_{P3}$ is larger than that of $I_{OS}$. A broken line indicates the reverse recovery current of the semiconductor switch. The offset current $I_{OS}$ is made sufficiently large so that the negative portion ($I_{OS}-I_{P3}$) of the pulse signal has a peak value smaller than the reverse recovery current $i_R$, and the pulse width $W_1$ thereof is made sufficiently shorter than the reverse recovery time $t_{rr}$. With such an arrangement, even if a pulse current flows in the reverse direction relative to a certain constant value, a bidirectional pulse signal transmission can be realized by using the reverse recovery current of the semiconductor switch. Further, the time duration $W_2$ during which a pulse current flows in the forward direction is set sufficiently longer than the reverse recovery time so that a stable reverse recovery characteristic is obtained thereby realizing a stable pulse current in the reverse direction with less waveform distortion.

Figure 7A:
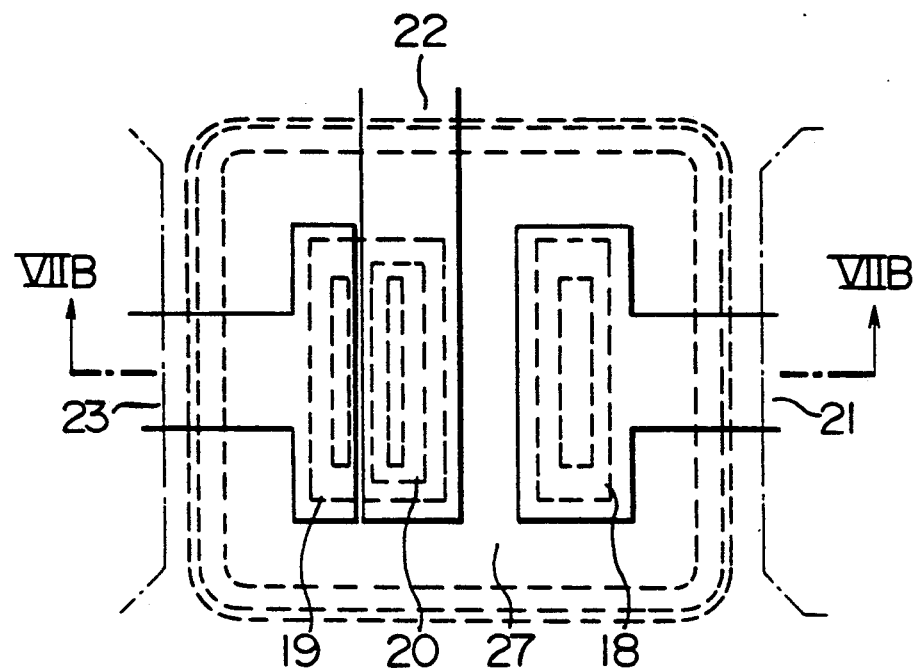
FIGS. 7A, 7B, 8A, 8B, 9A and 9B show thyristors used in the pulse signal transmission apparatus of this invention illustrated in plan views and cross sectional views.
Figure 7B:
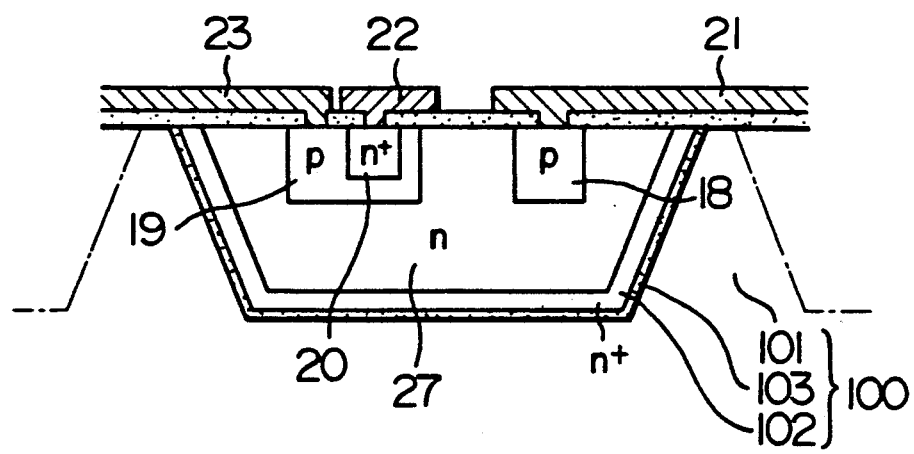

FIGS. 7A and 7B show the structure of a thyristor used as a semiconductor switch in the method of and apparatus for transmitting a pulse signal according to this invention. This thyristor is formed within a single monocrystal island of a substrate 100 isolated with dielectric material. There are formed within the island an n-layer 27, a p-layer 18 as an anode layer and a p-layer 19 as a base layer within the n-layer 27, and an n+-layer 20 as a cathode layer within the p-layer 19. An anode electrode 21, cathode electrode 22 and gate electrode 23 are in ohmic contact with the p-layer 18, n+-layer 20 and p-layer 19, respectively. One-dot-chain lines show other monocrystal islands within the substrate 100 isolated with dielectric material, these islands being used for fabricating the control circuit of the pulse signal transmission apparatus. The dielectric layer isolated substrate 100 includes, for example, a polycrystal support member 101, monocrystal islands 102, and dielectric films 103 interposed therebetween. As a semiconductor switch provided at the pulse signal transmission path through which a pulse current flows in the forward and reverse directions, the thyristor constructed as above may be used wherein when a pulse current is caused to flow in the reverse direction after flowing in the forward direction, a reverse recovery current flows mainly by carriers stored in the n-layer 27 to thus allow a reverse pulse current to be transmitted. Although the n-type substrate is used in the above embodiment, a thyristor formed in the p-type substrate may also be used with same advantageous characteristics.

Figure 8A:
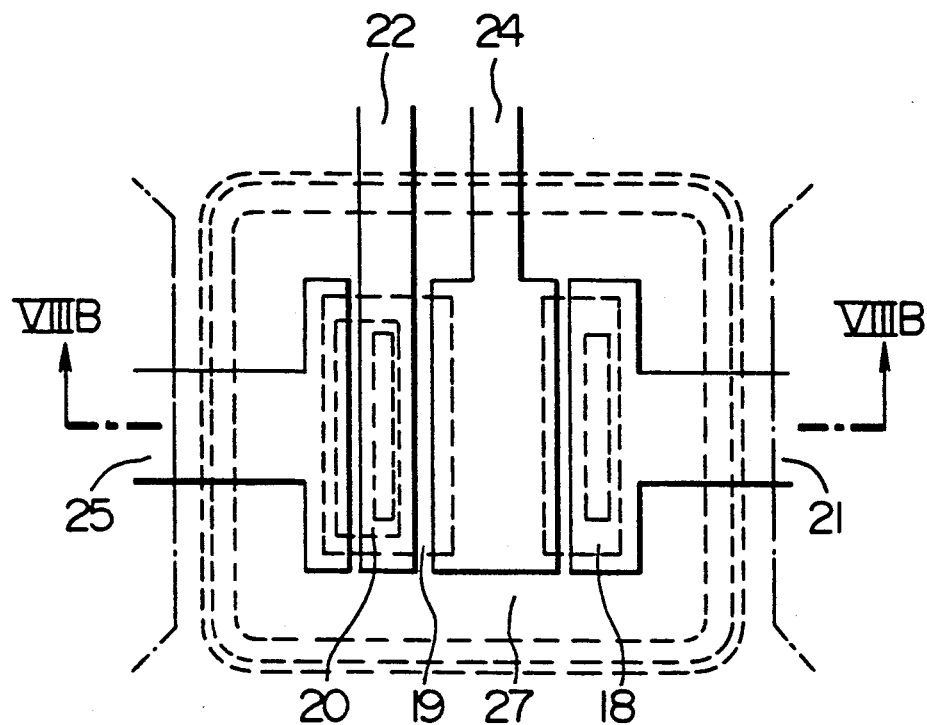
Figure 8B:
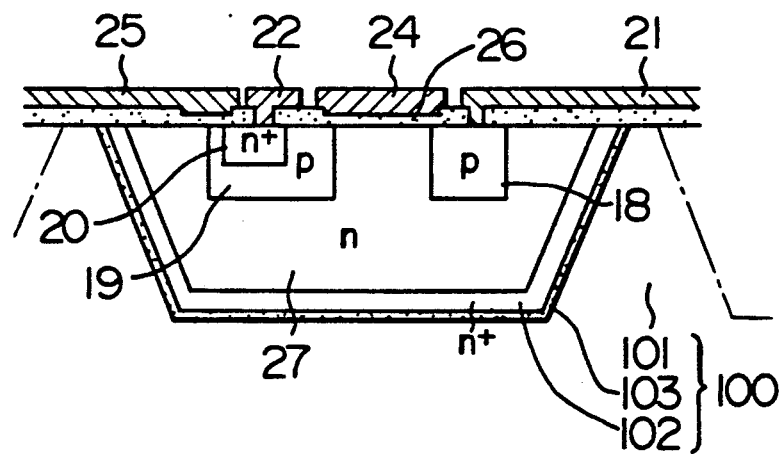

FIGS. 8A and 8B show another embodiment of a thyristor to be used in the method of and apparatus for transmitting a pulse signal according to this invention. This thyristor has a MOS gate thyristor structure and is formed within a single monocrystal island of a substrate 100 isolated with dielectric material. There are formed within the island an n-layer 27, a p-layer 19 as an anode layer and a p-layer 19 as a base layer within the n-layer 27, and an n+-layer 20 as a cathode layer within the p-layer 19. An anode electrode 21 and cathode electrode 22 are in ohmic contact with the p-layer 18 and n+-layer 20, respectively. A gate electrode 24 is formed on an insulating film 26 between the p-layers 18 and 19 above the n-layer 27. Another gate electrode 25 is formed on an insulating film 26 between the n+-layer 20 and n-layer 27 above the p-layer 19. The gate electrodes 24 and 25 are selectively used in dependence of its application. FIG. 8A is the plan view of the thyristor, and FIG. 8B is the cross section of FIG. 8A taken along line VIIIB—VIIIB.

If the thyristor of this embodiment is used as the switch provided in the pulse signal transmission path described previously, it is possible to drive it by using a MOS gate with a low drive power, while at the same time retaining the above-described characteristic feature of bidirectional pulse signal transmission. In addition, the anode and cathode layers are used as the sources so that the thyristor can be driven upon application of a gate voltage relative to either the anode layer or cathode layer.

Figure 9A:
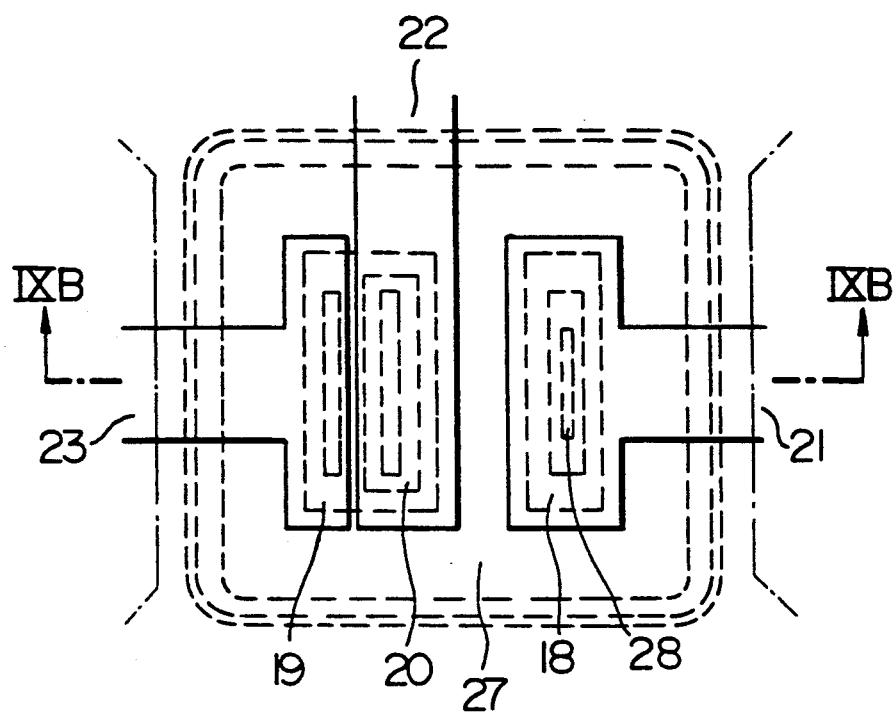
Figure 9B:
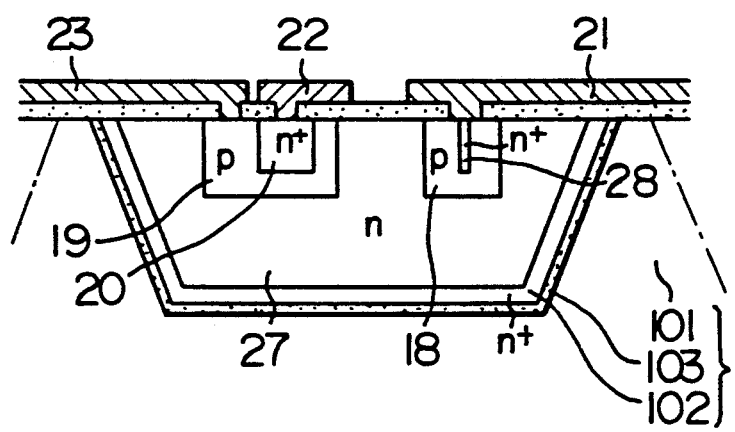

FIGS. 9A and 9B show a further embodiment of the thyristor used in the method of and apparatus for transmitting a pulse signal according to this invention. This thyristor is formed within a single monocrystal island of a substrate 100 isolated with dielectric material. There are formed within the island an n-layer 27, a p-layer 18 as an anode layer and a p-layer 19 as a base layer within the n-layer 27, an n+-layer 20 as a cathode layer within the p-layer 19, and an n+-layer 28 locally formed within the p-layer 18. An anode electrode 21 is in ohmic contact with the p-layer 18 and n+-layer 28. A cathode electrode 22 and gate electrode 23 are in ohmic contact with the n+-layer 20 and p-layer 19, respectively.

FIG. 9A is a plan view of the thyristor, and FIG. 9B is the cross section of FIG. 9A taken along line IX-B—IXB. The impurity concentration and dimension of the n+-layer 28 within the p-layer 18 are so determined that when the thyristor is biased in the reverse direction, latch-up of the thyristor is prevented by the four-layer structure of p-layer 19, n-layer 27, p-layer 18 and n+-layer 28. According to this embodiment, when the reverse current starts flowing following the flow of forward current, electrons are injected from the n+-layer 28 within the p-layer 18 so that the reverse recovery time becomes longer and the reverse recovery current increases, thereby allowing a larger negative pulse to be transmitted. This n+-layer 28 of this embodiment may be formed in the p-layer 18 of the thyristor shown in FIGS. 8A and 8B, with the same advantageous effects.

Typical preferred embodiments of this invention have been described. The invention is not limited to such embodiments only, but various modifications are possible.

As described so far, with the method of and apparatus for transmitting a pulse signal according to this invention, an offset signal is superposed upon a pulse signal to make the peak value of the positive pulse larger than that of the negative pulse. Accordingly, a pulse signal can be transmitted by using a single unidirectional semiconductor switch without any waveform distortion.

Further, a thyristor is formed which has a small region of opposite conductivity type within the anode layer. This thyristor therefore has a longer reverse recovery time and larger reverse recovery current so that it is suitable for use with the method of and apparatus for transmitting a pulse signal according to this invention.

We claim:

1. A method of transmitting a pulse signal, comprised of a combination of a positive pulse and a negative pulse, through a unidirectional thyristor providing a conduction modulation in an on-state, wherein the positive pulse of said pulse signal is transmitted through said unidirectional thyristor in a forward current direction during the on-state thereof and the negative pulse of said pulse signal is transmitted through said unidirectional thyristor in a reverse current direction during a reverse recovery period thereof, said method comprising: controlling the operation of said unidirectional thyristor so that during the on-state thereof an offset current is superposed upon said pulse signal thereby resulting in an absolute value of the positive pulse of said pulse signal larger than that of the negative pulse thereof.

2. A method of transmitting a pulse signal according to claim 1, wherein the width of the negative pulse of said pulse signal is substantially equal to or narrower than 10 microseconds.

3. A method of transmitting a pulse signal according to claim 1, wherein said offset current is set substantially equal to or larger than 5% and smaller than 50% of the sum of the peak values of said positive pulse and negative pulse.

4. A method of transmitting a pulse signal according to claim 1, wherein said offset current is substantially set equal to or larger than 25% and smaller than 50% of the sum of the peak values of said positive pulse and negative pulse.

5. A method of transmitting a pulse signal according to claim 1, wherein the pulse width of the negative pulse of said pulse signal is less than the reverse recovery time of said unidirectional thyristor, the reverse recovery time being associated with a reverse recovery current of said unidirectional thyristor.

6. A method of transmitting a pulse signal according to claim 5, wherein the negative pulse of said pulse signal has a peak of an absolute value that is less than that of the reverse recovery current.

7. A method of transmitting a pulse signal, comprised of a combination of a positive pulse and a negative pulse, through a unidirectional thyristor providing a conduction modulation in an on-state, wherein the positive pulse of said pulse signal is transmitted through said unidirectional thyristor in a forward current direction during the on-state thereof and the negative pulse of said pulse signal is transmitted through said unidirectional thyristor in a reverse current direction during a reverse recovery period thereof, said method comprising:

controlling the operation of said unidirectional thyristor so that in the on-state thereof said pulse signal is current modulated such that the positive pulse of said pulse signal has a peak of an absolute value greater tan that of the negative pulse of said pulse signal.

8. A method of transmitting a pulse signal according to claim 7, wherein the width of the negative pulse of said pulse signal is substantially equal to or narrower than 10 microseconds.

9. A method of transmitting a pulse signal according to claim 7, wherein the absolute value of the positive pulse of said pulse signal is set larger than that of the negative pulse thereof by an amount substantially equal to or larger than 5% and smaller than 50% of the sum of the peak values of said positive pulse and negative pulse.

10. A method of transmitting a pulse signal according to claim 7, wherein the absolute value of the positive pulse of said pulse signal is set larger than that of the negative pulse thereof by an amount substantially equal to or larger than 25% and smaller than 50% of the sum of the peak values of said positive pulse and negative pulse.

11. A method of transmitting a pulse signal according to claim 7, wherein the pulse width of the negative pulse of said pulse signal is less than the reverse recovery time of said unidirectional thyristor, the reverse recovery time is associated with a reverse current of said unidirectional thyristor, and the negative pulse of said pulse signal has a peak of an absolute value that is less than that of the reverse recovery current.

12. A method of transmitting a pulse signal, comprised of a combination of a positive pulse, a negative pulse and a zero level interposed between the positive and negative pulses, through a unidirectional thyristor providing a condition modulation in an on-state, wherein the positive pulse of said pulse signal is transmitted through said unidirectional thyristor in a forward current direction during the on-state thereof and the negative pulse of said pulse signal is transmitted through said unidirectional thyristor in a reverse current direction during a reverse recovery period thereof, said method comprising:

controlling the operation of said unidirectional thyristor so that during the on-state thereof an offset current is superposed upon said pulse signal thereby resulting in the positive pulse of said pulse signal having a peak of an absolute value larger than that of the negative pulse thereof.

13. A method of transmitting a pulse signal according to claim 12, wherein the width of the negative pulse of said pulse signal is substantially equal to or narrower than 10 microseconds.

14. A method of transmitting a pulse signal according to claim 12, wherein said offset current is a d.c. current.

15. A method of transmitting a pulse signal according to claim 12, wherein said offset current is set substantially equal to or larger than 5% and smaller than 50% of the sum of the peak values of said positive pulse and negative pulse.

16. A method of transmitting a pulse signal according to claim 12, wherein said offset current is substantially set equal to or larger than 25% and smaller than 50% of the sum of the peak values of said positive pulse and negative pulse.

17. A method of transmitting a pulse signal according to claim 12, wherein the pulse width of the negative pulse of said pulse signal is less than the reverse recovery time of said unidirectional thyristor, the reverse recovery time is associated with a reverse recovery current of said unidirectional thyristor, and the negative pulse of said pulse signal has a peak of an absolute value that is less than that of the reverse recovery current.

18. A method of transmitting a pulse signal, comprised of a combination of two types of positive pulses having different peak values and two types of negative pulses having different peak values, through a unidirectional thyristor providing a conduction modulation in an on-state, wherein the positive pulses of said pulse signal are transmitted through said unidirectional thyristor in a forward current direction during the on-state thereof and the negative pulses of said pulse signal are transmitted through said unidirectional thyristor in a reverse current direction during a reverse recovery period thereof, said method comprising:

controlling the operation of said unidirectional thyristor so that during the on-state thereof an offset current is superposed upon said pulse signal thereby resulting in a shifting of the peak values of the positive and negative pulses of said pulse signal in a positive direction so that the maximum peak value of the positive pulses thereof attains an absolute value greater than that of the negative pulses thereof.

19. A method of transmitting a pulse signal according to claim 18, wherein the pulse width of negative pulses of said pulse signal flowing during the reverse recovery time is less than the reverse recovery time of said unidirectional thyristor, the reverse recovery time is associated with a reverse recovery current of said unidirectional thyristor, and the negative pulses of said pulse signal, as a result of said offset current, have a maximum peak of an absolute value that is less than that of the reverse recovery current.

20. A pulse signal transmission apparatus comprising:
a pulse signal transmission path for transmitting a pulse signal from an input side to an output side thereof, said pulse signal including a combination of a positive pulse and a negative pulse;
a unidirectional thyristor provided at said pulse signal transmission path such that the flow of current from the input side to the output side of said signal transmission path corresponds to a forward current flow direction of said unidirectional thyristor, said unidirectional thyristor providing a conductance modulation in an on-state thereof; and
means for supplying an offset current to said pulse signal transmission path of a polarity corresponding to the forward current flow direction of said unidirectional thyristor,
wherein the positive pulse of said pulse signal is transmitted through said unidirectional thyristor in the forward current direction during the on-state thereof and the negative pulse of said pulse signal is transmitted through said unidirectional thyristor in a reverse current direction during a reverse recovery period thereof.

21. A pulse signal transmission apparatus according to claim 20, wherein the width of the negative pulse of said pulse signal is substantially equal to or narrower than 10 microseconds.

22. A pulse signal transmission apparatus according to claim 20, wherein said offset current is set substantially equal to or larger than 5% and smaller than 50% of the sum of the peak values of the positive pulse and negative pulse of said pulse signal.

23. A pulse signal transmission apparatus according to claim 20, wherein said unidirectional thyristor comprises:
a semiconductor substrate having a first region of one conductivity type, second and third regions of another conductivity type formed within the first region to form first and second p-n junctions, respectively, relative to the first region, a fourth region of the one conductivity type formed within the second region to form a third p-n junction relative to the second region, and a small region of the one conductivity type formed within the third region;
a first main electrode in ohmic contact with the third region and small region within the semiconductor substrate;
a second main electrode in ohmic contact with the fourth region within the semiconductor substrate; and
a control electrode coupled to the second region within the semiconductor substrate.

24. A pulse signal transmission apparatus according to claim 23, wherein said small region is a heavily doped impurity region thereby preventing unwanted latch-up within said unidirectional thyristor during reverse biasing thereof, and
wherein the first and second main electrodes are anode and cathode electrodes, respectively.

25. A pulse signal transmission apparatus according to claim 20, wherein the pulse width of the negative pulse of said pulse signal is less than the reverse recovery time of said unidirectional thyristor, the reverse recovery time is associated with a reverse recovery current of said unidirectional thyristor, and the negative pulse of said pulse signal has a peak of an absolute value that is less than that of the reverse recovery current.

26. A pulse signal transmission apparatus comprising:
a pulse signal transmission path for transmitting a pulse signal from an input side to an output side thereof, said pulse signal including a combination of a positive pulse, a negative pulse having a peak of an absolute value substantially the same as that of the positive pulse, and a zero level interposed between the positive pulse and the negative pulse;
a unidirectional thyristor provided at said pulse signal transmission path such that the flow of current from the input side to the output side of said signal transmission path corresponds to a forward current flow direction of said unidirectional thyristor, said unidirectional thyristor providing a conductance modulation in an on-state thereof; and
means for supplying an offset current to said pulse signal transmission path of a polarity corresponding to the forward current flow direction of said unidirectional thyristor, the offset current being smaller than the peak value of the positive pulse, wherein the negative pulse is transmitted through said unidirectional thyristor during a reverse recovery period thereof during which a reverse recovery current flow therethrough.

27. A pulse signal transmission apparatus according to claim 26, wherein the width of the negative pulse of said pulse signal is substantially equal to or narrower than 10 microseconds.

28. A pulse signal transmission apparatus according to claim 26, wherein said offset current is set substantially equal to or larger than 5% and smaller than 50% of the sum of the peak values of the positive pulse and negative pulse of said pulse signal.

29. A pulse signal transmission apparatus according to claim 26, wherein said offset current is set substantially equal to or larger than 25% and smaller than 50% of the sum of the peak values of the positive pulse and negative pulse of said pulse signal.

30. A pulse signal transmission apparatus according to claim 26, wherein said unidirectional thyristor comprises:
a semiconductor substrate having a first region of one conductivity type, second and third regions of another conductivity type formed within the first region to form first and second p-n junctions, respectively, relative to the first region, a fourth region of the one conductivity type formed within the second region to form a third p-n junction relative to the second region, and a small region of the one conductivity type formed within the third region;
a first main electrode in ohmic contact with the third region and small region within the semiconductor substrate;
a second main electrode in ohmic contact with the fourth region within the semiconductor substrate; and
a control electrode coupled to the second region within the semiconductor substrate.

31. A pulse signal transmission apparatus comprising:
a pulse signal transmission path for transmitting a pulse signal from an input side to an output side thereof, said pulse signal including a combination of a positive pulse, a negative pulse having a peak of an absolute value substantially the same as that of the positive pulse, and a zero level interposed between the positive pulse and negative pulse;

a unidirectional thyristor provided at said pulse signal transmission path such that the flow of current from the input side to the output side of said signal transmission path corresponds to a forward current flow direction of said unidirectional thyristor, said unidirectional thyristor providing a conductance modulation in an on-state thereof;

control means for supplying a control signal to said unidirectional thyristor; and means for supplying an offset current to said pulse signal transmission path of a polarity corresponding to the forward current flow direction of said unidirectional thyristor, the offset current being smaller than the peak value of the positive pulse, wherein the negative pulse is transmitted through said unidirectional thyristor during a reverse recovery period thereof during which a reverse recovery current flows therethrough.

32. A pulse signal transmission apparatus according to claim 31, wherein said unidirectional thyristor, control means and offset current supplying means are formed in a single semiconductor substrate.

33. A pulse signal transmission apparatus according to claim 31, wherein said unidirectional thyristor comprises:

a semiconductor substrate having a first region of one conductivity type, second and third regions of another conductivity type formed within the first region to form first and second p-n junctions, respectively, relative to the first region, a fourth region of the one conductivity type formed within the second region to form a third p-n junction relative to the second region, and a small region of the one conductivity type formed within the third region;

a first main electrode in ohmic contact with the third region and small region within the semiconductor substrate;

a second main electrode in ohmic contact with the fourth region within the semiconductor substrate; and a control electrode coupled to the second region within the semiconductor substrate.

34. A pulse signal transmission apparatus according to claim 33, wherein said small region is a heavily doped impurity region thereby preventing latch-up within said unidirectional thyristor during reverse biasing thereof, and wherein the first and second main electrodes are anode and cathode electrodes, respectively.

35. A pulse signal transmission apparatus according to claim 34, wherein said control signal is supplied to the control electrode of said unidirectional thyristor.

36. A pulse signal transmission apparatus according to claim 31, wherein the pulse width of the negative pulse of said pulse signal is less than the reverse recovery time of said unidirectional thyristor, the reverse recovery time is associated with a reverse recovery current of said unidirectional thyristor, and the negative pulse of said pulse signal has peak of an absolute value that is less than that of the reverse recovery current.

37. A method of transmitting a pulse signal comprised of a combination of a negative level and a zero level using a unidirectional thyristor exhibiting a conduction modulation in an on-state, comprising the steps of:

superposing an offset signal of a positive level on said pulse signal to convert said pulse signal into a pulse signal comprised of a combination of a positive pulse and a negative pulse; and transmitting the positive pulse of said converted pulse signal through the unidirectional thyristor during a forward current conduction period thereof and transmitting the negative pulse of the converted pulse signal through the unidirectional thyristor during a reverse recovery period thereof.

* * * * *